United States Patent [19]

Laskaris et al.

[11] Patent Number: 4,586,017
[45] Date of Patent: Apr. 29, 1986

[54] PERSISTENT CURRENT SWITCH FOR HIGH ENERGY SUPERCONDUCTIVE SOLENOIDS

[75] Inventors: Evangelos T. Laskaris, Schenectady; Donald W. Jones, Burnt Hills, both of N.Y.

[73] Assignee: General Electric Company, Schenectady, N.Y.

[21] Appl. No.: 530,925

[22] Filed: Sep. 12, 1983

[51] Int. Cl.$^4$ ............................................. H01L 43/00
[52] U.S. Cl. ................................. 338/32 S; 307/245; 307/306; 361/19
[58] Field of Search ............... 338/32 S; 307/245, 306; 361/331, 332, 385, 19, 379–381; 200/289, 329, 262

[56] References Cited

U.S. PATENT DOCUMENTS

| | | | |
|---|---|---|---|
| 3,054,978 | 9/1962 | Schmidlin et al. | 338/32 S |
| 3,141,979 | 7/1964 | Rinia et al. | 307/245 |
| 3,278,808 | 9/1966 | Boufeld | 307/306 |
| 3,308,310 | 3/1967 | Burnett | 338/32 S |
| 3,359,394 | 12/1967 | Mains | 200/166 |
| 3,800,256 | 3/1974 | Garwin | 335/216 |
| 4,164,777 | 8/1979 | Kneip, Jr. et al. | 338/31 S |

FOREIGN PATENT DOCUMENTS

| | | | |
|---|---|---|---|
| 2140314 | 1/1979 | Fed. Rep. of Germany | 338/32 S |
| 0074030 | 8/1981 | Fed. Rep. of Germany | |
| 56-18482 | 2/1981 | Japan | 338/32 S |
| 57-21881 | 2/1982 | Japan | 338/32 S |
| 57-35387 | 2/1982 | Japan | 338/32 S |
| 57-76889 | 5/1982 | Japan | 338/32 S |
| 57-92723 | 6/1982 | Japan | 338/32 S |

OTHER PUBLICATIONS

Krebs et al., Superconducting Devices for Energy Storage and Switching, Conference 4th Int. Cryogenic Conference Eindhoven, Netherlands May 24–26, 1972 pp. 172–176.

R. Ludemann et al., "Supraleitende Schalter und ihre Anwendung in supraleitenden Magnetsystemen und elektrischen Netzen" 952 Elektrie vol. 34 (1980) No. 2, pp. 89–91.

Primary Examiner—Clarence L. Albritton
Assistant Examiner—M. M. Lateef
Attorney, Agent, or Firm—Lawrence D. Cutter; James C. Davis, Jr.; Marvin Snyder

[57] ABSTRACT

Electrical switches used in conjunction with high energy superconductive windings must be able to quickly absorb large amounts of electrical energy since switching of the superconducting current is accomplished by means of transition to the resistive state in the switch portion of the superconducting current loop. Furthermore, to minimize the heat generated during the transition to the resistive state, the switch itself should exhibit a relatively high resistance while at the same time exhibiting a low external magnetic field. The switch should also exhibit minimal stray magnetic fields, especially in those applications requiring field uniformity. These objectives are achieved in a persistent current switch which includes a length of superconductive material disposed in a compact, thermally insulated volume which also includes a mechanism for heating at least a portion of the superconductive conductor in the switch in order to return it to its resistive state. Furthermore, there is included a mass of thermally conductive material within the volume which is in thermal contact with at least a substantial portion of the superconductive conductor to mitigate the effects of hot spots occurring within the switch.

15 Claims, 4 Drawing Figures

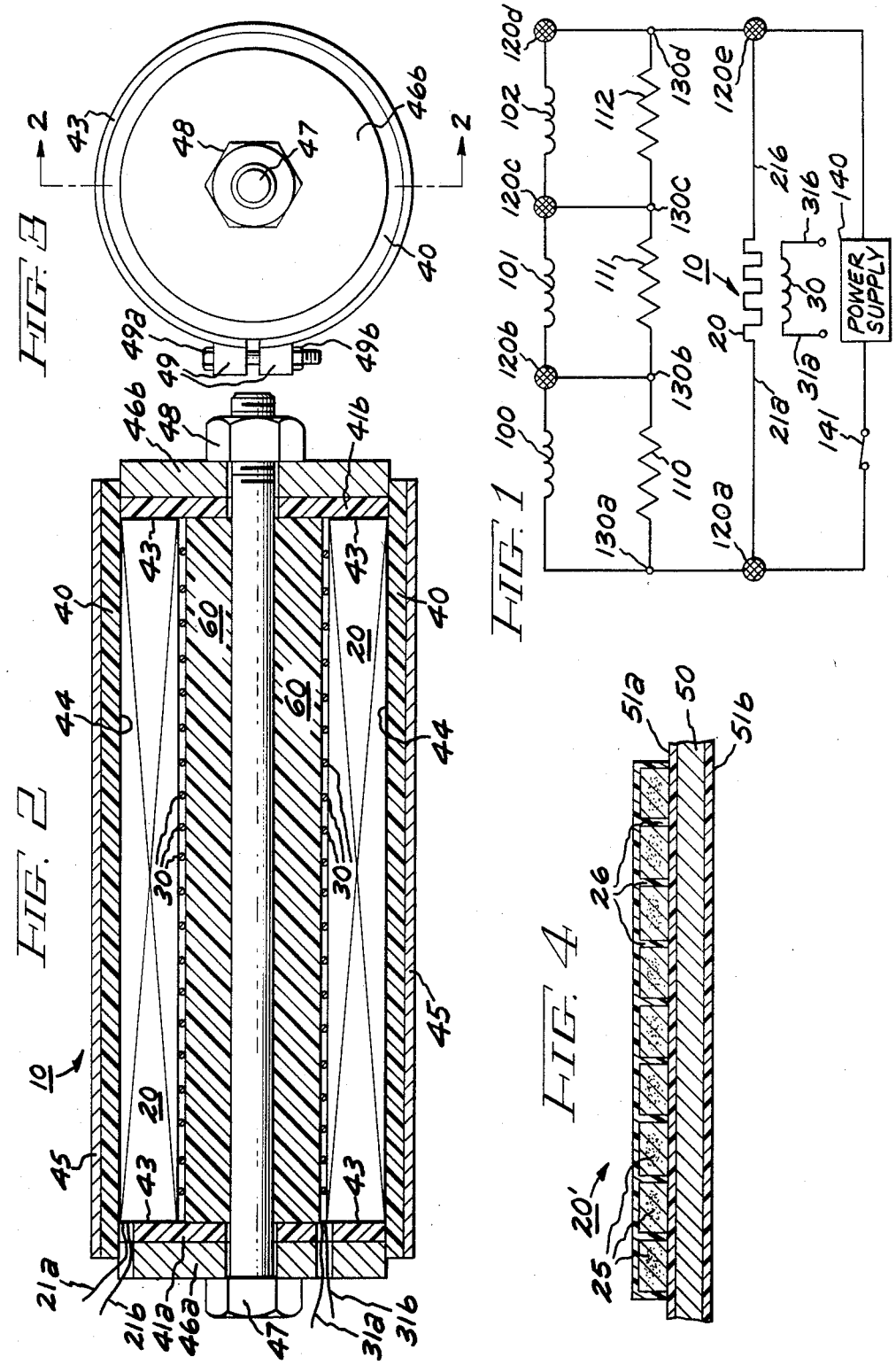

PERSISTENT CURRENT SWITCH FOR HIGH ENERGY SUPERCONDUCTIVE SOLENOIDS

BACKGROUND OF THE INVENTION

The present invention relates to electrical switches for use in superconductive systems. More particularly, the present invention relates to switches for use in superconductive systems which store high levels of electrical and magnetic energy, particularly in the form of persistent current loops.

In conventional superconductive electrical systems in which persistent current loops are present, the cessation of current is typically accomplished through the act of heating a portion of the superconducting conductor to a point above its transition temperature. Once a portion of the current loop exhibits a finite resistance, electrical energy is dissipated in accordance with the well known $I^2R$ law of power dissipation, where I is the current and R the resistance of the circuit. The heat that is generated, quickly causes adjacent areas of the conductor to also enter the resistive state and in a very short time the persistent current is quenched. However, when the level of current in the persistent loop is high, large levels of electrical energy must be dissipated in a short time in a small volume. When this is the case, a transition to the resistive state in order to turn off the current in the windings can result in damage to the superconductive material, particularly in the switch. Furthermore, in order for the switch portion of the superconductive wire to provide the necessary electrical resistance in its resistive state, the switch conductor must in some applications be quite long, 1,500 feet being a representative length. This length of wire must be compactly and firmly supported since small movements of superconductive conductors can cause them to switch into the normal, resistive state at an unacceptably low current level. Furthermore, because of the high levels of energy that must be dissipated, the material which is employed in the switch must have sufficient thermal mass to dissipate the energy in the current loop when the transition to the resistive state is made. Furthermore, the thermal conductivity of the switch must be high enough to prevent hot spots from forming that would otherwise damage the switch structure. However, since the switch is part of the persistent superconducting current loop, it must be maintained at a temperature below the transition point. With most materials that are presently available which exhibit superconductive properties, the transition temperature is typically below about 10° K., although some transition temperatures are higher. Accordingly, the superconductive circuit must be contained within a coolant, such as liquid helium. However, the presence of a superconducting switch in such a coolant could produce the boiling of unacceptably large quantities of liquid helium. Typically boiled off helium vapor is vented to the atmosphere. Accordingly, it is highly desirable to provide thermal insulation between the superconductive conductor in the switch and the coolant in which the switch is disposed. Furthermore, since a switch is typically contained within a bath at a temperature of about 4.2° K., it is necessary to insure that all materials employed in the switch are compatible with the coolant and the temperature ranges encountered in the environment. Accordingly, thermal expansion coefficients of the materials employed are important considerations. The switch sould also have a thermal insulating jacket that allows the switch body to be raised above the temperature of the coolant in which it is immersed. Even relatively small leaks of liquid helium through a thermally insulating jacket could allow unacceptably large heat losses. Insulating materials that could be employed, such as nylon and polytetrafluoroethylene (PTFE), which have desirably low thermal conductivities, also exhibit a high degree of shrinkage at liquid helium temperatures and they tend to leak. Accordingly, it is seen that a switch for use in superconducting current loops carrying high levels of electrical energy must be carefully designed to exhibit not only superconductivity, but also finite levels of resistance in a thermally harsh and varying environment and should be able to dissipate large quantities of electrical and thermal energy without developing hot spots when the switch is made resistive.

SUMMARY OF THE INVENTION

In accordance with a preferred embodiment of the present invention, a persistent current switch for high energy superconductive circuits comprises a length of superconductive conductor wire disposed in a compact volume together with a means for thermally insulating this volume and means disposed within the volume for heating at least a portion of the superconductive conductor. Furthermore, the switch includes a mass of thermally conductive material in thermal contact with a substantial portion of the superconductive conductor so as to hasten the transition of the switch material to a resistive state and to prevent the formation of localized hot spots which could deleteriously effect future switch operation. Additionally, the superconductive conductor in the switch of the present invention is preferably disposed as a bifilar winding about a central cylindrical core of glass fiber and epoxy. Furthermore, the switch is preferably surrounded by an aluminum enclosure. The superconductive winding core is preferably disposed in thermal contact with a material such as copper however, a thin, electrically insulating layer is disposed between the superconductive material and the copper which functions as a means for assuring rapid, even, thermal dissipation throughout the insulated switch volume.

Accordingly, it is an object of the present invention to provide a superconducting switch exhibiting relatively high electrical resistance in the normal, resistive state.

It is an additional object of the present invention to provide a superconductive switch exhibiting sufficient thermal mass and diffusivity to dissipate large amounts of electrical energy as a result of transition to the resistive state.

It is also an object of the present invention to provide a superconductive switch which is thermally insulated from a liquid coolant medium in which it is immersed.

It is a still further object of the present invention to provide a superconductive switch for high persistent current levels and which is capable of operation in the adverse environment found within coolants such as liquid helium.

It is also an object of the present invention to provide a superconductive switch which is relatively immune to problems caused by thermal expansion and contraction.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 1 is a schematic electrical circuit diagram illustrating a typical system in which the switch of the present invention is employed;

FIG. 2 is a cross-sectional side elevation view of a persistent current superconducting switch in accordance with the present invention;

FIG. 3 is an end view of the switch shown in FIG. 2;

FIG. 4 is a cross-sectional side elevation view of a portion of a single layer of the superconductive winding shown in FIG. 2.

DETAILED DESCRIPTION OF THE INVENTION

FIG. 1 is a schematic electrical circuit diagram illustrating a typical circuit in which the switch of the present invention is employed. In this circuit coils 100, 101 and 102, and switch 20 comprise superconductive material such as alloys of niobium and titanium. Additionally, the conductors connecting coils 100, 101, 102 and switch 20 in a circular current loop, also comprise superconductive material. These circuit elements are typically disposed within a coolant bath such as liquid helium so as to maintain their temperature below the critical temperatures for superconductivity (typically about 10° K.). Additionally, certain joints, namely those designated as nodes 120a, 120b, 120c, 120d, and 120e are specifically designated as being joints between superconductive materials and, in fact, these joints themselves exhibit the zero resistance property at the appropriate temperature. The other nodes designated in the circuit in FIG. 1, namely nodes 130a, 130b, 130c, and 130d, do not necessarily have to comprise superconductive joints. Superconductive coils 100, 101, and 102, are preferably connected in parallel with conventional resistive elements 110, 111, and 112, respectively. These conventional resistive elements provide a means for dissipating energy within the coils in the event that the corresponding coil enters the resistive or ohmic state and limits the energy transfer to the persistent current switch during a switch quench by providing a current path parallel to the protected circuit elements.

Under normal startup conditions, coils 100, 101 and 102, and any inter-connecting wires are cooled to below their critical temperatures. At this time, DC power supply 140 is connected to the circuit through switch 141 and the current from the power supply is slowly increased to the desired level of operating current $I_o$. In applications contemplated in the present invention, $I_o$ is typically between approximately 500 and 2,000 amperes. During the transition to this final steady state current value, the voltage V across the series connection of coils 100, 101, and 102, (that is, the voltage V between nodes 130a and 130d) obeys the relation $V = L\, di/dt$, where V is the voltage, L is the equivalent inductance of the three coils, and i is the current through the coils. During this transition period, element 20 in switch 10 is typically still in the normal resistive state and it is therefor required to dissipate energy at the rate of $V^2/R$, where R is the resistance of element 20 when this element is in its ohmic or non-superconductive state. Accordingly, it is seen that in order to minimize power dissipation in switch 10 during startup, it is necessary to insure that R is a reasonably large value. As $di/dt$ goes to zero, and as the superconductive element in switch 10 reaches a temperature below the critical temperature, the voltage across switch 10 and all voltage drops around the current loop go to zero and it is then possible to remove power supply 140 from the circuit.

The circuit of FIG. 1 is particularly useful in producing high strength, uniform magnetic fields for nuclear magnetic residents (NMR) imaging applications. In such applications, a high strength, highly uniform magnetic field is required. In particular, the magnetic field strength for such applications ranges between about 0.04 and about 1.5 Tesla, or more. In these applications, it is important that the magnetic fields generated by the conductors in the superconducting loop do not produce stray magnetic fields of their own which could deleteriously affect the uniformity of the field that is otherwise produced by coils 100, 101, and 102. Accordingly, in such applications it is either necessary that element 20 in switch 10 be wound in a bifilar fashion so as to minimize any stray magnetic field produced or switch 10 must be located in a position sufficiently far from the main winding coils 100, 101 and 102. However, this latter positioning is generally not preferred since it is desired to dispose all of the superconductive circuit elements within a single coolant bath.

Accordingly, it is seen that the requirements of the circuit of FIG. 1 dictate that superconductive circuit element 20 should exhibit a high normal resistance value. In general, the resistance of a resistive circuit element may be controlled by varying the material, its length, or its cross-sectional area. In the present situation, the material of element 20 is already determined by the requirement that it comprises, at least in part, a superconductive material. The form of the superconductor is a composite of filaments of superconductive alloy embedded in a matrix of normally conducting material such as copper, aluminum, or more rarely, copper-nickel alloy. Higher normal resistance can be achieved by minimizing the matrix cross-section or increasing the resistivity. The practical lower limit of the matrix/superconductor ratio is approximately 1:1 but a ratio of approximately 1.5:1 produces an acceptable switch with copper matrix wire. Lower ratios and higher resistivity matrix material (such as copper nickel alloy) produces more efficient switching, but greater care must be given to the lead wire design to insure stability at high current density levels. An acceptable value of normal switch resistance for the circuits herein contemplated is approximately 0.03 ohms. For a specific design, this resistance entails a conductor length of approximately 1,500 feet. While it is also theoretically possible to control the resistance of element 20 through the utilization of conductors having a small cross-sectional area, this design is highly impractical since it can lead to the formation of localized hot spots during switch operation. Accordingly, it is seen then that element 20 in switch 10 should comprise a relatively long length of conductor in order to achieve the desired relatively large value for R. Typically, the value of R for circuits that are contemplated herein is approximately 0.03 ohms. This value of R may be effected by a conductor length of approximately 1,500 feet.

Much of the above description is related to the turning on of switch 10 in order to effect the formation of a high intensity current loop comprising element 20, coils 100, 101, and 102, and their associated adjoining leads and superconductive joints 120a–e. When it is desired to turn switch 10 off, that is to switch element 20 to its resistive state, it is only necessary to supply a relatively small amount of energy to heater coil 30 through leads 31a and 31b. Typically, a power dissipation in coil 30 of approximately 2.5 watts for a period of as little as one second is sufficient to trigger the superconductive to resistive state transition. However, the design of switch 10 should be such that, as a result of the transition, the relatively high levels of energy which are dissipated in switch 10 do not result in the formation of destructive hot spots. For this reason, it is desirable to have the superconductive conductor in element 20 disposed in a compact configuration to promote thermal diffusion. At the same time, it is necessary to insure electrical insulation between the various turns of element 20. Moreover, since superconductivity may be defeated, especially locally, by means of slight motion of the superconductors, it is also desirable to provide rigid support for the entire structure. Accordingly, it is seen that switch 10 should comprise superconductive wire disposed so that the various portions of the wire are electrically insulated from one another but yet at the same time maintained in close thermal contact in a rigid structure. Furthermore, it is seen that switch 10 should also possess element 20 configured so as to exhibit minimum stray magnetic field production. Additionally, since switch 10 is preferably disposed within a coolant, say at 4.2° K., and since a temperature rise of the switch to above the critical temperature is necessary to turn the switch off, the switch's mass of superconductor should be thermally insulated from the coolant bath to minimize the heater power and the time lag to initiate the transition to the normally conducive stage. The degree of thermal insulation should be carefully chosen, however, since an overly effective insulation unacceptably delays the re-cooling to the superconducting state and thus prolongs the cycle time to the succeeding switch-on condition.

A switch satisfying all these criteria is illustrated in FIGS. 2–4. FIG. 2 in particular illustrates a cross-sectional view through a switch in accordance with the present invention. In particular, superconductive element 20 is shown as a cylindrical coil disposed about glass fiber/epoxy core 60. Heating element coil 30 having leads 31a and 31b is shown disposed in helical fashion between core 60 and superconductive winding layers 20. Winding layers 20 are configured in a bifilar arrangement of conductors so as to minimize stray magnetic field production. Additionally, surrounding annular superconductive winding 20, there is disposed a thermally insulating sleeve 40 comprising a material such as nylon or polytetraflouroethylene (PTFE). Additionally, between thermal insulation 40 and superconductive winding 20, there is also preferably disposed compressible layer 44 comprising a material such as leather or cellulose. Lastly, thermal jacket 40 is preferably surrounded by metal jacket 45 preferably comprising a material exhibiting a high coefficient of thermal expansion. Such materials, when subjected to the cold temperatures of the liquid coolant bath tend to shrink and to produce forces which tend to hold the elements of the switch in close thermal contact. Similar structures are likewise provided at each end of cylindrical switch 10. In particular, flat annular disks or washers 43, comprising compliant material such as leather or cellulose are disposed at the ends of coil 20, as shown. Additional thermal insulation for the ends of the switch is provided by thermally insulating disks 41a and 41b which typically comprise material similar to jacket 40, namely nylon or polytetrafluoroethylene. Finally, each end of cylindrical switch 10 is capped by an annular metal (preferably aluminum) cap such as 46a or 46b. The structure is held together, at least in part, by means of bolt 47 and nut 48. Bolt 47 is disposed through central apertures in disk 46a, 41a, 41b and 46b respectively. Additionally, it is seen that the shaft of bolt 47 is disposed through a central bore in core 60. With respect to core 60 it is also pointed out that it preferably comprises a glass fiber and epoxy structure in which the layers of glass are oriented at right angles with respect to the longitudinal direction of bolt 47. Apertures are also provided in disks 41a and 46a for the passage therethrough of superconductive leads 21a and 21b which are integral with superconductive winding 20 and for the passage of normal resistive leads 31a and 31b which are connected to helical heating element 30. Heating element 30 typically comprises Nichrome wire. The foregoing structure insures that even at low operating temperatures, there exists excellent thermal insulation between the interior of switch 10 and the coolant bath in which it is disposed.

FIG. 3 illustrates an end view of the switch shown in FIG. 2. In particular, FIG. 3 further illustrates the fact that jacket 45 may be provided with flanges 49 through which bolts 49a are disposed so that nut 49b may be adjusted to further hold jacket 45 in position about insulating jacket 40.

It is also seen that a cylindrical shell 44 of compliant material may also be disposed about superconductive winding 20.

FIG. 4 illustrates a portion 20' of superconductive winding 20. In particular, there is shown superconductive windings 25 disposed on a sheet of thermally conductive material 50. Sheet 50 preferably comprises a high thermal conductivity material such as copper. Sheet 50 acts to provide a path of low thermal impedance in the axial direction as well as to provide thermal mass to absorb magnetically stored energy from the discharging magnet coils 100, 101 and 102. Each insulated superconductive conductor 25 preferably comprises a plurality of niobium-titanium filaments or wires disposed within a matrix of conductive material such as copper, aluminum, or copper-nickel alloy. Typically the ratio of matrix to superconductor cross section is in the range of from about 1 to about 2. Additionally, each sheet 50 of thermally conductive material has disposed thereon insulating layers 51a and 51b to provide the desired electrical insulation between turns and between winding layers. Because superconductivity may be dependent, at least in part, upon the rigidity of the structure, winding 20 is preferably potted in a hardenable compound such as epoxy. In particular, such a compound preferably fills gaps 26 between adjacent windings and wicks into glass cloth, 51a, 51b, dispersed between layers in coil 20. Sheet 50 is typically approximately 0.01 inches to approximately 0.02 inches thick. Glass fiber cloth 51a and 51b is typically only about 2 mil. thick. Sheet 50 is also preferably plated on both sides with insulation such as Formex ® to insure a good bond to the epoxy resin with which coil 20 is vacuum impregnated prior to assembly.

From the above, it may be appreciated that the persistent current switch of the present invention provides the features which are desired in such a switch. In particular, it is seen that the switch may be manufactured and configured so as to be able to contain long lengths of superconductive material. While the above description is directed to the configuration in which the superconductive winding 20 is disposed as an annular, bifilar coil, other configurations may also be employed, as long as winding 20 is arranged in close thermal contact with itself. This generally requires disposition within a relatively compact volume. It is also seen that the switch of the present invention provides a compact and firm support for this relatively long length of superconductive material so that movements of the wires do not tend to cause the switch to enter the resistive state at unacceptably low levels of current. In addition, it is seen that the switch of the present invention exhibits a relatively large thermal mass in order to dissipate the energy associated with the excited superconducting solenoids in the transition to the resistive state. It is also seen that the switch of the present invention exhibits sufficient thermal conductivity during such transitions so that hot spots within the switch do not develop. It is also seen that the switch of the present invention exhibits thermal insulating structures that allow the switch to be raised above the temperature of the liquid coolant in which it is immersed so that unacceptably large heat transfer to the coolant does not occur. It is furthermore seen that the switch of the present invention comprises materials which are well suited to the harsh temperatures and conditions to which it is exposed.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A persistent current switch for high energy superconductive circuits comprising:
   a substantially closed housing;
   a length of electrically insulated superconductive conductor disposed in said housing;
   means for thermally insulating said housing;
   a mass of material exhibiting a high thermal conductivity, said material being disposed within said housing and in thermal contact with at least a portion of said superconductive conductor; whereby heat generated within said housing is rapidly and uniformly transmitted throughout the interior volume of said housing, and
   means for heating at least a portion of said superconductive conductor, said heating means being disposed within said housing.

2. The switch of claim 1 in which said superconductive conductor is disposed as a winding about a central cylindrical core.

3. The switch of claim 2 in which said winding is bifilar.

4. The switch of claim 2 in which said core comprises glass fiber and epoxy.

5. The switch of claim 1 in which said thermal insulation means comprises material selected from the group consisting of nylon and polytetrafluoroethylene.

6. The switch of claim 1 in which said thermal insulation means comprises a cylinder of material disposed about said superconductive conductor.

7. The switch of claim 1 in which said housing comprises material exhibiting a high coefficient of thermal expansion.

8. The switch of claim 7 in which said housing comprises aluminum.

9. The switch of claim 7 in which said housing is a cylinder.

10. The switch of claim 1 in which said means for heating comprises at least one resistive conductor disposed in proximity to said superconductive conductor.

11. The switch of claim 1 in which said mass of thermally conductive material comprises at least one sheet of material on which said superconductive conductor is disposed.

12. The switch of claim 11 in which said sheet is electrically insulated from said superconductive conductor.

13. The switch of claim 11 in which said sheet comprises copper.

14. The switch of claim 11 in which said sheet is separated from said superconductive conductor by a layer of glass fiber material.

15. The switch of claim 1 in which said superconductive conductor is disposed within an epoxy matrix.

* * * * *